(12) United States Patent
Bosiers et al.

(10) Patent No.: US 7,071,502 B2
(45) Date of Patent: Jul. 4, 2006

(54) CHARGE COUPLED DEVICE USED IN AN IMAGE SENSOR AND A METHOD OF MAKING THE CHARGE COUPLED DEVICE

(75) Inventors: Jan Theodoor Jozef Bosiers, Edegem (BE); Agnes Catherina Maria Kleimann, Eindhoven (NL)

(73) Assignee: Dalsa Corporation, Ontario (CA)

( * ) Notice: Subject to any disclaimer, the term of this patent is extended or adjusted under 35 U.S.C. 154(b) by 0 days.

(21) Appl. No.: 10/869,862

(22) Filed: Jun. 18, 2004

(65) Prior Publication Data

US 2005/0280044 A1 Dec. 22, 2005

(51) Int. Cl.
*H01L 29/76* (2006.01)

(52) U.S. Cl. .................. 257/223; 257/225; 438/75; 438/200; 438/719

(58) Field of Classification Search ............. 257/225, 257/223, 220, 221, 230; 438/75
See application file for complete search history.

(56) References Cited

U.S. PATENT DOCUMENTS 5,442,208 A * 8/1995 Bosiers et al. ............ 257/223

* cited by examiner

*Primary Examiner*—Edward Wojciechowicz
(74) *Attorney, Agent, or Firm*—Millen, White, Zelano & Branigan

(57) ABSTRACT

It is known to bring the surface into the inverted state in CCD imaging devices with buried channels during the integration period in order to keep the dark current low (All Gates Pinning). A desired potential profile, with wells in which the charge is integrated bounded by potential barriers, is obtained through, e.g. a doping profile in the channel. Line-shaped constrictions in the thickness or the doping concentration of the well enable charge-reset and function also as an anti-blooming barrier. In a charge coupled device according to the invention, the line-shaped constrictions in the thickness or the doping concentration of the second layer run perpendicular to the length direction of the channel and parallel to the gates and at least one line shaped constriction is positioned below each series of gates. In this way, an increased charge storage capacity and optical sensitivity are obtained while electronic shutter functionality is maintained.

13 Claims, 4 Drawing Sheets

CHARGE COUPLED DEVICE USED IN AN IMAGE SENSOR AND A METHOD OF MAKING THE CHARGE COUPLED DEVICE

BACKGROUND OF THE INVENTION

1. Field of the Invention

The present invention relates to a buried channel charge coupled device in which a built-in potential difference in a channel establishes potential wells that alternate with potential barriers in the channel upon the application of equal voltages to the gates. In particular, the invention relates to such a charge coupled device that includes means for charge reset that comprises constrictions in the thickness or the doping concentration of the well under the channel that are line-shaped when viewed in projection.

2. Description of Related Art

A charge coupled device sensor is known from U.S. Pat. No. 5,388,137 that has been issued on Feb. 7, 1995. The known device is suitable for use in the so-called AGP (=All Gates Pinning) operating mode, which renders it possible to suppress to a substantial degree the dark current which is largely determined by the surface states. In this way the unpleasant influence of local defects which are visible as white spots during display is largely eliminated as well. In order to obtain sufficiently large charge packages per pixel also in the AGP mode, the known device is provided with means for optimizing the potential profile in the channel whereby potential well in which charge can be stored alternating with potential barriers are formed in the channel upon the application of equal voltages to the gates. In the above patent it is proposed to use a voltage difference between the clock voltages which is substantially equal to, but opposed to the potential difference in the channel obtained by the doping profile, which potential difference is present for the purpose of charge integration in the integration time and is at least substantially eliminated during the transport phase. In this way a substantial difference in doping is allowed for, which makes it possible to increase the charge storage per pixel during the integration time while the surface is in inversion, so that the leakage currents can be kept low. In addition, electric charge may be removed from the transport channel (so called charge reset) before or during the integration time in that a positive voltage pulse is applied to the substrate. For localizing the charge reset, the above patent incorporates by reference U.S. Pat. No. 5,442,208 that has been issued on Aug. 15, 1995 and which discloses (see FIG. 2) line shaped restrictions in the thickness of the second layer positioned below the channel and running in the length direction thereof.

A disadvantage of the known device is that its maximum charge storage and optical sensitivity are still limited. This holds in particular if the pixel size is further reduced which is an ever present desire.

SUMMARY OF THE INVENTION

The invention improves the state of the art by obtaining the result that the disadvantage mentioned in the previous paragraph is avoided and the result mentioned in the next paragraph is obtained, thus a device with low leakage current while at the same time much charge per storage element can be store while the optical sensitivity is large, even for very small pixels.

In an example of the invention, a charge coupled device of the buried channel type with a semiconductor body, includes a first layer of a first conductivity type, a second layer of a second conductivity type opposite to the first, and a third layer of the first conductivity type. The first layer adjoins a surface of the semiconductor body and forms a buried channel for storage and transport of electric charge. The second layer lies below and adjoins the first layer. The second layer forms a burying layer of the channel, and the second layer forms a barrier layer. The third layer lies below and adjoins the second layer. The third layer may be a semiconductor substrate or a semiconductor region deposited on such a substrate (e.g., in the form of an epitaxial layer or even on any other substrate). The third layer is the layer through which excess charge can be drained from the first layer. The surface of the semiconductor body is provided with a system of electrodes with a series of gate electrodes which are situated above the buried channel. The system of electrodes are connected to a voltage source for the at least temporary application of such a voltage to the gate electrodes that an inversion layer of the second conductivity type is formed adjoining the surface below the gate electrodes. Means are present for obtaining a built-in potential difference in the channel whereby potential wells in which charge can be stored alternating with potential barriers are formed in the channel upon the application of equal voltages to the gate electrodes. For example, potential profiles are obtained by dopant implants along the channel. The amount and type of dopant to be implanted depends on the voltages that are to be applied to the gate electrodes according to the specific design. Means are present for charge reset through the barrier layer. The means for charge reset include constrictions in the thickness or the doping concentration of the second layer below the channels that viewed in projection are line-shaped. The line-shaped constrictions in the thickness or the doping concentration of the second layer run perpendicular to the length direction of the channel and parallel to the gate electrodes. At least one line shaped constriction is positioned below each series of gate electrodes.

As another example, a method of manufacturing the charge coupled device that has first, second and third layers, the first layer forming a buried channel, is characterized in that line-shaped constrictions in the thickness or the doping concentration of the second layer are formed such that they run perpendicular to the length direction of the channel and parallel to gate electrodes and in that at least one line shaped constriction is positioned below each series of gate electrodes. The charge coupled device is of the buried channel type with a semiconductor body in which are formed the first layer of a first conductivity type, the second layer of the second conductivity type opposite to the first, and the third layer of the first conductivity type. The first layer adjoins a surface of the body and forms a buried channel for storage and transport of electric charge. The second layer lies below and adjoins the first layer and forms a barrier layer. The third layer lies below and adjoins the second layer and is a layer through which excess charge can be drained from the first layer. The surface of the semiconductor body is provided with a system of electrodes forming a series of gate electrodes. The series of gate electrodes are situated above the buried channel and are connected to a voltage source for the at least temporary application of such a voltage to the gate electrodes. The voltage applied to the gate electrodes is such that an inversion layer of the second conductivity type adjoining the surface may be formed below the gate electrodes. Means are provided for obtaining a built-in potential difference in the channel whereby potential wells in which charge can be stored alternating with potential barriers are formed in the channel upon the application of equal voltages to the gate electrodes. Means are provided for charge reset, said means include constrictions in the thickness or the doping concentration of the second layer below the channels that viewed in projection are line-shaped.

BRIEF DESCRIPTION OF DRAWINGS

These and other aspects of the invention will be apparent from and elucidated with reference to the embodiments described hereinafter, to be read in conjunction with the following drawings.

The figures are diagrammatic and not drawn to scale, the dimensions in the thickness direction being particularly exaggerated for greater clarity. Corresponding parts are generally given the same reference numerals and the same hatching in the various figures.

DETAILED DESCRIPTION OF PREFERRED EMBODIMENTS

Figure 1:
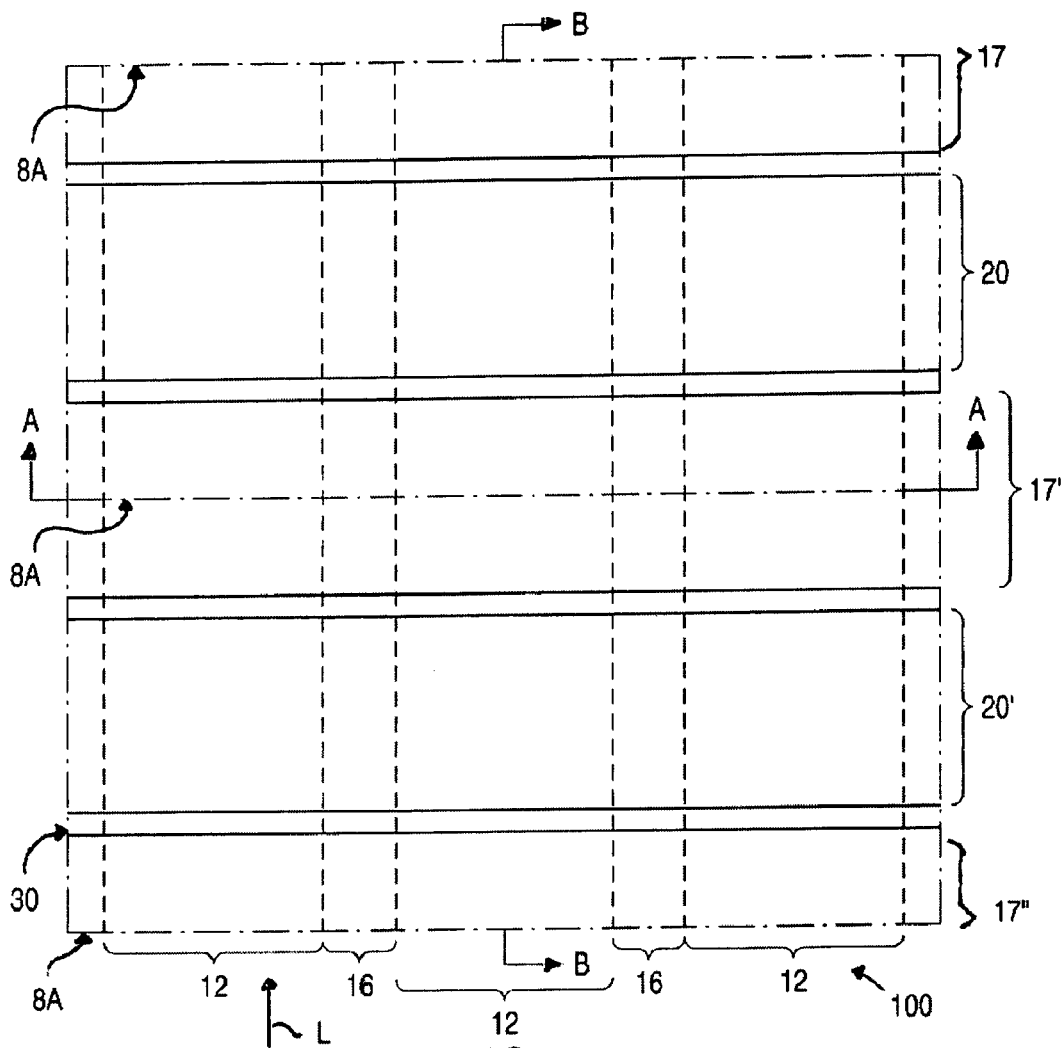
FIG. 1 diagrammatically shows a plan view of a relevant part of a first embodiment of a charge-coupled image sensor in accordance with the invention.

The invention has for its object, inter alia, to provide a charge coupled device sensor in which the leakage currents are kept low in that the surface is brought into the inverted state, while at the same time comparatively much charge per charge storage element can be stored while the optical sensitivity is large, even for very small pixels.

A charge coupled device according to the invention is characterized in that the line-shaped constrictions in the thickness or the doping concentration of the second layer run perpendicular to the length direction of the channel and parallel to the gates and in that at least one line shaped constriction is positioned below each series of gates. The invention is firstly based on the recognition that in the known device the length of that part of the line shaped constriction, which is effective during charge reset below a gate as it acts as a region with a lower barrier, is limited to the width of the gate. The width of the gate being the size of the gate in a direction parallel to the length direction of the channel and thus a direction perpendicular to the charge transport direction in the gate. For a roughly square pixel containing four gates this means that said length is about ¼ of the total length of a gate. By rotating said line-shaped constrictions over 90 degrees, the length of the region of the line-shaped constriction that may be effective during charge reset, is increased by a factor of about four. In this way charge reset, in a higher doped region below a gate which is positioned above or close to the line-shaped constrictions is made considerably more easy. This allows for a higher doping concentration in the higher doped region used for forming the built-in potential difference in the channel below such a gate. As a result thereof, also the blooming barrier between two higher doped regions is increased. In this way a higher maximum charge storage capacity is obtained. Moreover, since the overall doping concentration in the channel, i.e. the doping concentration outside the higher doped regions, does not need to be lowered to obtain still satisfactory operation of the device, the overall sensitivity of the device can be relatively high.

The above effects and recognitions may be in particular relevant for very small pixels. Since in real devices the potential distributions along a line-shaped constriction are three-dimensional functions, a less optimal charge reset might be present in the known device below a gate in the two parts of the line-shaped constrictions that are most close to the two side-edges of the gate. For very small pixels and thus for a very small width of the gate, the length of said end parts might form a substantial part of the total length of a line shaped constriction below a gate. In such a case, the effect of a rotation over 90 degrees of the line shaped constriction—as in a device according to the invention—might be very strong since the relative contribution of said parts close to the edges of a gate is thus more than proportionally lowered.

Finally, an important additional advantage of the device according to the invention is that its manufacture is not more complex than the manufacture of the known device since the same number of masks may still be used. This is in particular the case if the constrictions are made in the thickness of the second layer. However, similar results can be obtained if the constriction is formed in the doping concentration of the second layer. This means that locally the doping concentration is lowered in the second layer in a line-shaped area. It is to be noted here that the line-shaped constrictions may also be formed by a combination of the two measures and thus may comprise a locally thinner and lower doped second layer.

In an embodiment of a charge coupled device according to the invention that the means for obtaining a built-in potential difference in the channel comprise a gradient in the doping concentration in the first layer in the direction of the channel such that the doping concentration is higher in regions below a first group of electrodes and lower below a second group of electrodes, the gates associated with the first group of electrodes being interdigited with the gates associated with the second group of electrodes. Such a device has several advantages, like a higher charge storage capacity and a sufficient quantum efficiency. Another advantage is the possibility of a self-aligned formation of the higher doped regions in a double poly-silicon process. The regions with relatively high dope may be formed by implanting additional, e.g. n-type, regions in a moderately high doped n-type channel region. Alternatively, a highly doped n-type channel may be locally lowered by introducing locally doping atoms of the opposite conductivity type which partly compensate the e.g. n-type doping of the channel.

Another embodiment is characterized in that the means for obtaining a built-in potential difference in the channel comprises a gradient in the doping concentration in the first layer in the direction of the channel such that the doping concentration is higher in regions below a first group of electrodes comprising sets of three neighboring gates and lower below a second group of electrodes comprising single gates that are interdigited with the sets of neighboring gates of the electrodes of the first group. The main advantage of this embodiment is that the charge capacity is relatively high. Other advantages are that the sensitivity is more homogeneous in the center of a pixel and thus that the angular response is better, especially when using on-chip micro-lenses.

What has been said in the previous embodiment on the formation of the higher doped regions in the first layer also holds for this embodiment. In this embodiment there is a particular advantage in using compensation to locally lower a high (n-type) doping of the channel between one of each four gates. If the gates are formed in a double poly process— in which the gates are formed interdigited in two groups— one of each two gates yet to be formed after formation of the first group, may be covered by e.g. photoresist. In this way, the other one which should have the lower doping concentration could still be formed in a self-aligned manner. This, because the edges of the photoresist mask used may be positioned above the two gates neighboring the lower doped region. Thus, the latter positioning is not critical.

In further modifications, the gates are formed by using a so-called triple poly process. In that case also self-alignment can be obtained with respect to either locally increasing the, e.g. n-type, doping of the channel over the width of two (for a 3-phase pixel) or three (for a 4-phase pixel) gates or locally decreasing a high, e.g. n-type, channel dope by partial compensation over the width of one gate. In these case no additional photoresist mask is needed to obtain said self-alignment. For further clarification of these modifications we refer to the description of the preferred embodiments, in particular to the description of the second embodiment.

Preferably a line-shaped constriction is centered with respect to the regions in which the doping concentration in the channel is higher. This is the optimal position for charge-reset and anti-blooming operation in the thickness direction.

In the embodiments discussed so far (except for the three-phase three-poly implementation), the gates are preferably formed alternating in two different interposed layers, preferably comprising poly silicon layers. However also a triple poly process may be used advantageously for the manufacturing of a device according to the invention with a 3-phase pixel or with a 4-phase pixel.

From the above it is clear that the charge coupled device according to the invention is in particular suitable for use in a charge coupled image sensor.

A method of manufacturing a charge coupled device of the buried channel type with a semiconductor body in which are formed a first layer of a first conductivity type which adjoins a surface of the body and which forms a buried channel for storage and transport of electric charge, a second layer of the second conductivity type opposite to the first which lies below and adjoins the first layer and forms a barrier layer, and a third layer of the first conductivity type which lies below and adjoins the second layer and through which excess charge can be drained from the first layer, the surface being provided with a system of electrodes with a series of gates which are situated above the buried channel and which are connected to a voltage source for the at least temporary application of such a voltage to the gates that an inversion layer of the second conductivity type adjoining the surface may be formed below the gates, while means are provided for obtaining a built-in potential difference in the channel whereby potential wells in which charge can be stored alternating with potential barriers are formed in the channel upon the application of equal voltages to the gates, and while means are provided for charge reset said means comprising constrictions in the thickness or the doping concentration of the second layer below the channels that viewed in projection are line-shaped, according to the invention is characterized in that the line-shaped constrictions in the thickness or the doping concentration of the second layer are formed such that they run perpendicular to the length direction of the channel and parallel to the gates and in that at least one line shaped constriction is positioned below each series of gates.

Another embodiment is characterized in that for the means for obtaining a built-in potential difference in the channel a gradient in the doping concentration in the first layer in the direction of the channel is chosen such that the doping concentration is higher in regions below a first group of electrodes and lower below a second group of electrodes, whereby the gates associated with the first group of electrodes are interdigited with the gates associated with the second group of electrodes.

Yet another embodiment is characterized in that for the means for obtaining a built-in potential difference in the channel a gradient in the doping concentration in the first layer in the direction of the channel is chosen such that the doping concentration is higher in regions below a first group of electrodes comprising sets of three neighboring gates and lower below a second group of electrodes comprising single gates electrodes that are interdigited with the sets of neighboring gates of the electrodes of the first group.

Preferably, a line-shaped constriction is centered with respect to the regions in which the doping concentration is higher in the channel.

More specifically, FIG. 1 is a diagrammatic plan view of a relevant part (semiconductor body 30) of a charge-coupled image sensor in accordance with an embodiment of the invention, and FIGS. 2 through 11 are diagrammatic, cross-sectional views of several stages in the manufacture of the image sensor shown in FIG. 1. The semiconductor body 30 includes a body which is made, either in whole or in part, of semiconductor material. When the semiconductor body 30 is made in part of semiconductor material, the semiconductor body 30 may be a semiconductor region deposited on a substrate, for example, a dielectric substrate. The sensor shown in this example is an n-type buried channel sensor with vertical anti-blooming.

In the manufacture of this sensor, an n-type doped silicon slice 1 having a surface 2 (often referred to as a substrate) is used as the starting material. Semiconductor regions 8, 12 and 16 adjoining the surface 2 are formed in the slice 1 by implantation of ions of dopants and subsequent thermal treatments. In this example, the surface 2 is provided with a gate dielectric 3, 4 comprising a layer of silicon oxide 3 and a silicon nitride layer 4 deposited thereon. A system of electrodes 17, 20 is formed on the gate dielectric 3, 4.

Figure 2:
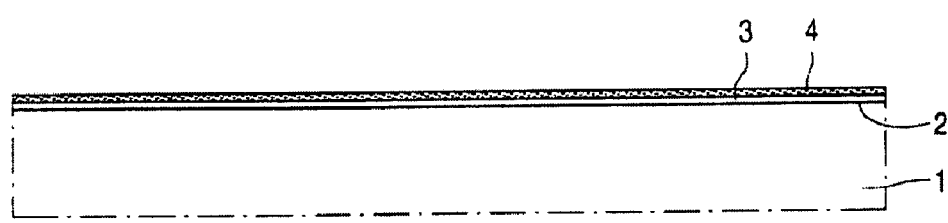
FIG. 2 through FIG. 11 are diagrammatic, cross-sectional views along the lines A—A or B—B of several stages in the manufacture of the charge-coupled image sensor shown in plan view in FIG. 1 by means of a method in accordance with the invention.
Figure 3:
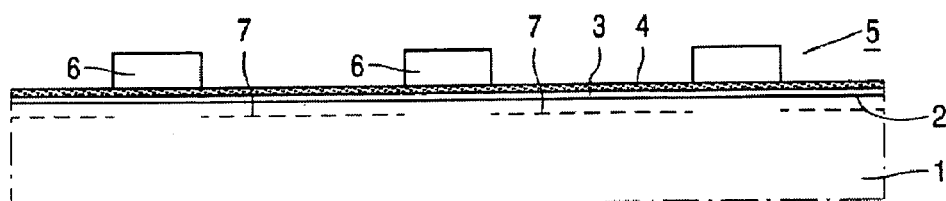
Figure 4:
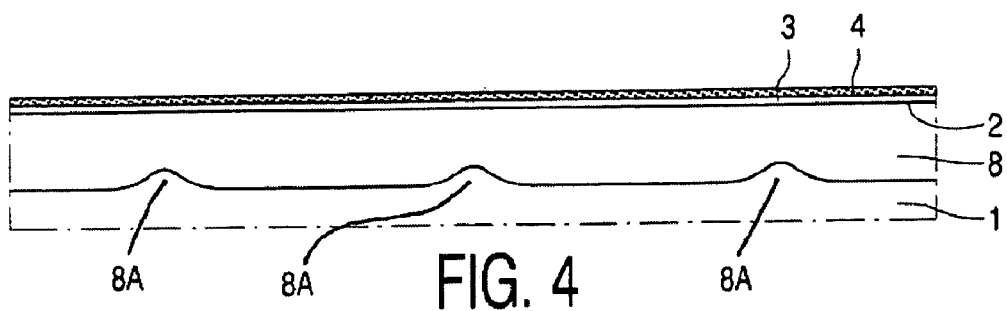

The following process steps, illustrated in FIGS. 2 through 4, are shown with reference to the cross-sections taken on the line B—B in FIG. 1.

As shown in FIG. 2, the gate dielectric 3, 4 is formed homogeneously on the surface 2 of the slice 1. In a first step, an oxide layer 3 is formed by thermal oxidation of the surface 2 of the slice 1. Next, a silicon nitride layer 4 is deposited.

After the gate dielectric 3, 4 has been formed, p-type doped regions, commonly referred to as p-wells, adjoining the surface 2 are formed in the slice 1. In practice, generally more than one image sensor is formed on the slice. For each sensor, a p-well, as described hereinafter, is formed not only for the actual sensor, but p-wells also are formed for electronics to be integrated in the sensor, such as a read-out register and signal amplifiers. To form the p-well of the actual sensor, a photoresist mask 5 comprising strips of photoresist 6 extending transversely to the plane of the drawing is provided on the gate dielectric 3, 4 as shown in FIG. 3. Subsequently, boron ions are implanted through mask 5 into slice 1 at locations indicated in FIG. 3 by means of dashed lines 7. After the removal of the photoresist mask 5, a thermal treatment is carried out leading to the formation of the p-well 8. The implanted ions diffuse in the slice so as to form a p-well 8 as shown in FIG. 4. As shown in FIG. 4, the p-well thickness locally—i.e. below the strips of photoresist 6 extending transversely to the plane of the drawing in FIG. 3—is smaller than the thickness in regions not located below the photoresist strips 6. The smaller thickness of the p-well 8 lies below where the strips of photoresist 6 were. These regions of smaller thickness are formed in what is referred to as line shaped constrictions 8A and are depicted in FIG. 4 as ridges extending transversely to the plane of the drawing in FIG. 4. These line shaped constrictions 8A in the thickness of the p-well 8 are located below the gate dielectric 3, 4 and oriented along the direction of gate electrodes to be later formed on the gate dielectric 3, 4 in a subsequent manufacturing step. This is quite contrary to known devices In known devices line-shaped thickness constrictions 8A run parallel to the channel regions 12 of the sensor instead parallel to the directions of the gate electrodes.

The following process steps, illustrated in FIGS. 5 through 8, are shown with reference to the cross-sections taken on the line A—A in FIG. 1.

Figure 5:
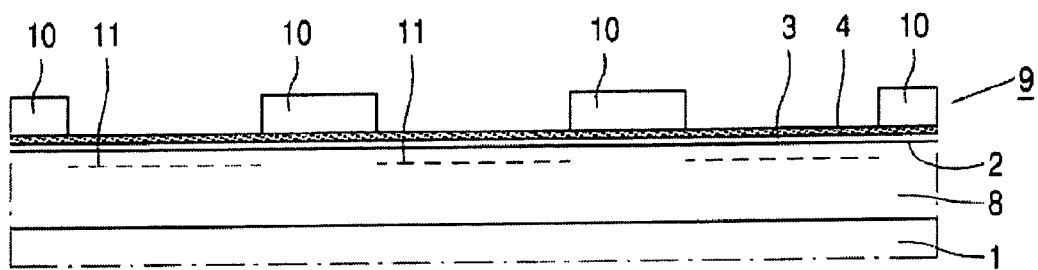
Figure 6:
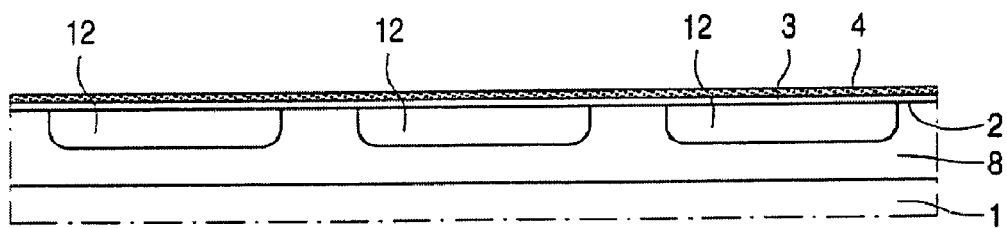

As shown in FIG. 5, after the formation of the p-well 8 under the gate dielectric 3, 4, a photoresist mask 9 is formed comprising strips of photoresist 10 extending transversely to the plane of the drawing. This photoresist mask 9 is used to define n-type channels to be formed in the p-well 8. After the formation of the photoresist mask 9, phosphor ions, indicated by means of dashed lines 11, are implanted through the gate dielectric 3, 4 and into the p-well 8. After the removal of the photoresist mask 9, the slice is subjected to a thermal treatment wherein the n-type channels 12, shown in FIGS. 1 and 6, are formed. In the cross-sections depicted in FIGS. 5 through 8, the p-well 8 has, contrary to the known device, a uniform thickness b. In FIG. 1, the channel regions 12 are shown in a plan view indicated by means of dashed lines.

Figure 7:
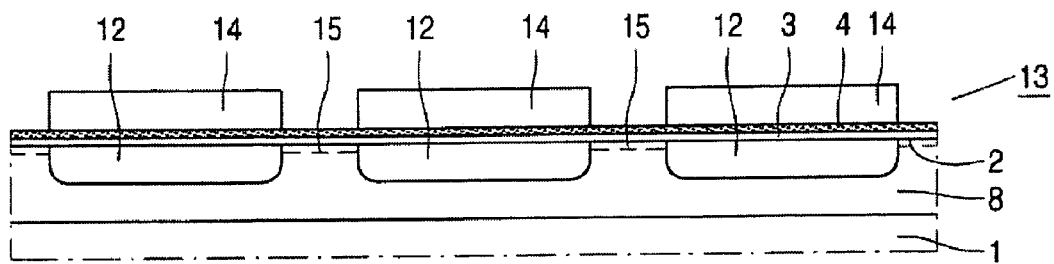
Figure 8:
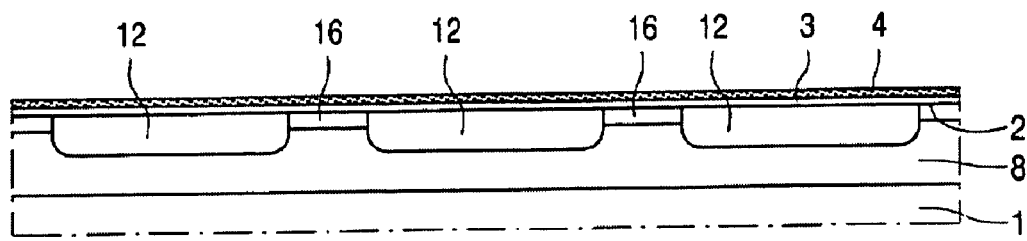

After the formation of the n-type channels 12, a next photoresist mask 13 is provided on the gate dielectric 3, 4 as shown in FIG. 7. The next photoresist mask 13 comprises strips of photoresist 14 extending transversely to the plane of the drawing of FIG. 7. The photoresist mask strips 14 serve to define channel-stop regions in the p-well 8 to separate the n-type channels 12 from each other. After the formation of the photoresist mask 13, boron ions are implanted through the photoresist mask 13 and into the slice 1. The implanted ions are indicated in FIG. 7 by means of dashed lines 15. After the removal of the photoresist mask 13, the slice is subjected to a thermal treatment wherein the p-type channel-stop regions 16 are formed as shown in FIG. 8. The channel-stop regions 16 are also shown in a plan view in FIG. 1 where the channel-stop regions 16 are indicated by means of dashed lines. It is to be noted that the channel 12 might be formed in such a way that the doping concentration varies in the thickness direction from a higher value in a region close to the surface 2 to a lower value where the channel borders the p-well 8. This may easily be obtained by two implantations with different implantation fluxes and energies. In the FIGS. 5 through 8 such a possible difference in doping concentration is not indicated separately.

The following process steps, illustrated in FIGS. 9 and 10, are again shown with reference to the cross-sectional views taken on the line B—B in FIG. 1.

After the formation of the semiconductor regions 8, 12 and 16, a conductive layer of polycrystalline silicon is deposited on the gate dielectric 3, 4. A first system of gate electrodes 17, 17', 17" (see FIGS. 1 and 9 but not 10) are etched in the polycrystalline silicon layer. These gate electrodes are provided with an insulating layer of thermally formed silicon oxide 18. By virtue of the presence of the silicon nitride layer 4, a mask is not necessary to carry out the oxidation process. The whole device is subsequently covered with a silicon nitride layer 19. A plan view of the electrodes 17, 17', 17" is shown in FIG. 1. These electrodes 17, 17', 17" are used to form higher doped regions 12A below the gates 17 in a self-aligned manner. Here these regions 12A are n-type regions.

Figure 9:
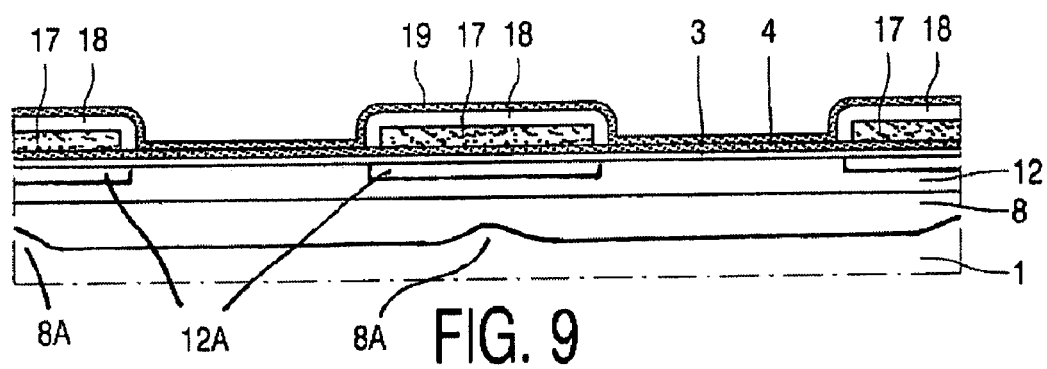

Through the windows formed between neighboring gates electrodes 17, as shown in FIG. 9, a p-type implantation is performed which lowers the n-type doping concentration in the p-type channel 12. In this way, the regions 12A, shown in FIG. 9, still have the higher n-type doping of the upper part of region 12. The n-type channel region 12 is formed by two n-type implantations: a first deeper region with a first doping concentration and a second shallower region with a second doping concentration. The second doping concentration is a higher concentration than the first doping concentration. The shallower higher doped second region is used to form the higher doped n-type regions 12A. The higher doped n-type regions 12A are formed by locally compensating the higher doped second region by a shallow partly compensating p-type implantation.

In this embodiment, the region 12 initially comprises a first deep, low doped n-region (indicated by reference numeral 12) and a second shallow, higher doped n-region which lies at the depth of regions 12A but runs over the whole width of FIG. 9. Then, using masks 17, a shallow compensating p-type implantation is done through the layers 3, 4 between the masks 17. As a result, the shallow, higher doped n-region mentioned above, splits up into the shallow, higher doped n-type regions 12A. Between the latter, the doping is still retype but with a lower doping concentration than the regions 12A. Thus region 12 effectively comprises two regions: higher doped n-type regions 12A and the remainder of the complete region 12, being n-type but with a lower doping concentration.

In an alternatively example, the n-type region 12 is formed by a single n-type implantation. The local regions 12A, with higher doping, are formed in a self-aligned manner by locally by implanting additional n-type impurities between two gates electrodes 17. In such a case, the n-type regions 12A shown in FIG. 9, are to be viewed translated to the right (or left) by one gate electrode width.

Figure 10:
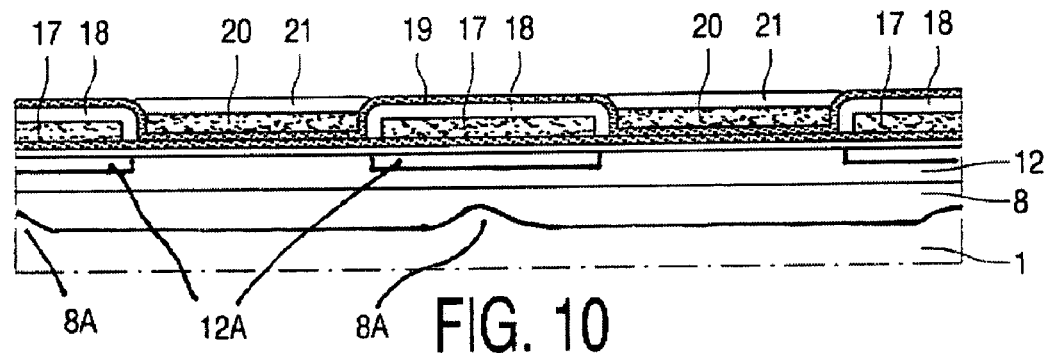
Figure 11:
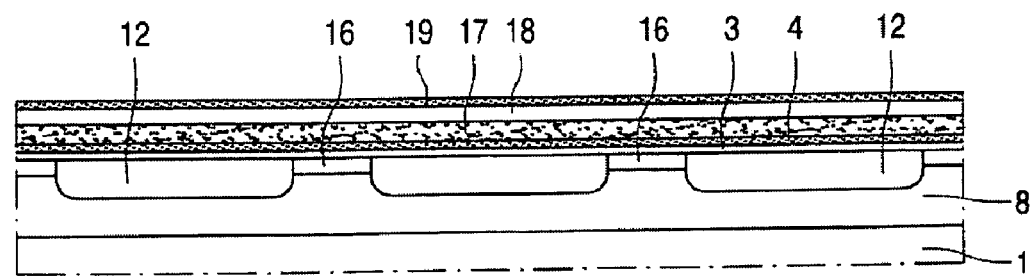

After the formation of the first system of gate electrodes 17, a next layer of polycrystalline silicon is deposited and patterned to form a second system of gate electrodes 20, 20' which extend between the gate electrodes of the first system of gate electrodes 17. Also these gate electrodes are provided with a thermally formed layer of silicon oxide 21. By virtue of the presence of the silicon nitride layer 19, this oxidation step also does not require a mask. A plan view of the electrodes 20 is shown in FIG. 1. FIG. 10 shows the sensor thus manufactured in a cross-sectional view taken on the line B B in FIG. 1. Finally, FIG. 11 shows a cross-section of the sensor in this—final—stage of its manufacture again along the line A—A in FIG. 1.

In operation, an image is projected on such an image sensor while electric voltages applied to the gate electrodes 17, 20 are such that, during a certain integration time, charge packets are collected in the channels 12 below adjacent groups of electrodes 17, 20 (for example groups of four electrodes). The amount of charge in these pixels depends upon the amount of light incident on the pixels. After the integration time, electric pulses are applied to the electrodes 17, 20, causing the charge packets to be transported through the channels 12 to a read-out register. The image information thus obtained can be read from this read-out register. The depth and the doping concentration of the semiconductor regions 8 and 12 are chosen to be such that, in the thinner parts 8A of the p-well 8 below the channels 12, such a potential barrier is formed that charge generated in the channels 12 by exposure to light cannot exceed a maximum. Any excess charge can flow across the potential barrier to the part of the slice 1 situated below the p-well 8. Thus, excess charge is precluded from spreading over adjacent pixels.

The device of this example may be operated as described in the above mentioned U.S. Pat. No. 5,442,208.

Figure 12:
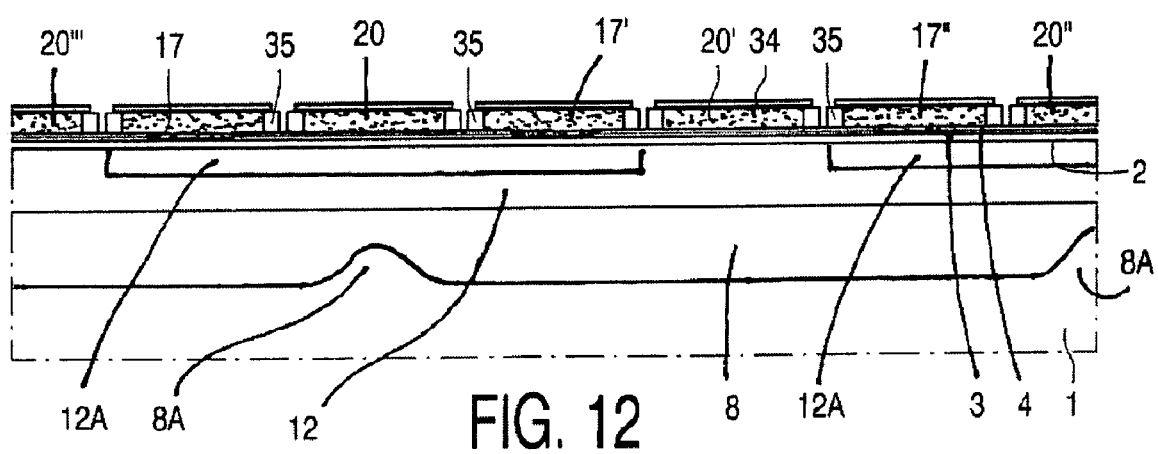
FIG. 12 shows a diagrammatic, cross-sectional view along the line B—B of a plan view as in FIG. 1 of a second embodiment of a charge-coupled image sensor in accordance with the invention.

FIG. 12 shows a diagrammatic, cross-sectional view along the line B—B of a plan view of a second embodiment of the invention. Regions 34, 35 comprise insulating material like silicon dioxide or silicon nitride, the reference numerals of the other regions have been already explained in the first example. A difference with the previous example is that now—for each pixel—below three gate electrodes 17, 20, 17', a higher doped region 12A is formed. Positioned to alternate between each group of gate electrodes—each pixel—is a gate electrode 20, 20' below which no higher doped n-type region 12A is present. The gate electrodes 17, 17', 20, 20' may be formed in a single polycrystalline layer as is described for example in WO 02/29852 that has been published on Apr. 11, 2002 and that is hereby incorporated by reference. In such a case the gate electrodes should be aligned to the higher doped regions 12A using alignment marks.

In an exemplary modification of the above first example, not shown in the drawing, the gate electrodes are formed using a so-called double poly layer process just as in the first example. However, in a stage of manufacture which corresponds FIG. 9, one of the two windows positioned between neighboring gate electrodes 17, 17' and gate electrodes 17', 17" is covered with e.g. photoresist. For example, the window between gate electrodes 17',17" may be covered with photoresist. Since the position of the edge borders of said photoresist on top of gate electrodes 17' and 17" is not critical, the method of this modification is self-aligned in practice. This photoresist blocks the, for example, p-type implantation that would otherwise implant and lower the n-type doping concentration in the n-type channel 12 beneath the photoresist. In this way, there is formed interruptions in the high n-type doping concentration regions of channel 12 that are disposed between the higher doped n-type regions 12A. These interruptions have a width of three gate electrodes that are formed by compensating a high doped uniformly formed n-type region 12A as described in the previous example.

In another favorable modification of the second embodiment, the gate electrodes are formed during a so-called triple poly layer process. This again offers various possibilities to use self-alignment in the manufacturing process of a device with a 3-phase pixel or a 4-phase pixel.

One possible opportunity to use self-alignment forms the gradient in the doping concentration by locally adding n-dopants to an n-doped channel, and the addition of the n-dopants can be done in a self-aligned manner. For example, in a four phase pixel (see FIG. 12), a first (series of) gate(s) 20''', 20' is first formed in the first poly layer. Then, the remaining three (series of) gate(s) 17, 20, 17' may subsequently be formed by second and third poly layer processes. In the second poly layer process, two (series of) gates 17,17' are formed adjacent to the gates 20''', 20' that were formed in the first poly layer. In the third poly layer process, a (series of) single gates 20 is formed between the gates 17, 17' that were formed in the second poly layer.

Another possible opportunity to use self-alignment forms the gradient in the doping concentration by partially compensating a channel, e.g. by local additional p-type implants to an n-type channel. The implantation may be done in a self aligned manner after the first and second poly layer processes but before the third poly layer process as discussed above wherein a (series of) single gate(s) 20 is formed.

In both cases, either adding an n-type dopant or adding a p-type dopant, a region in the channel 12 is formed with a doping concentration that is higher than in the remainder of the channel 12, and this region of higher concentration extends over the width of three gates 17,20,17', the total number of gates 17,20,17',20' per pixel being four. See FIG. 12.

In an example of a series of 3-phase pixels formed using a triple poly process and locally increasing the dopant concentration of the n-type channel, the first phase gate in each of the series of pixels is formed in the first poly process. Thereafter, an additional n-type implantation can be done a self-aligned manner between the first gates of the series of pixels, i.e., at the locations of the second and third gate of each pixel. Subsequently, the second and third gates are formed in a second and third poly process, respectively.

The device of this example is operated with a constant offset between the groups of gate electrodes, i.e., pixels, during transport. During the integration period, the voltages applied to all four gate electrodes 17,20,17',20' are, for example, at −5 Volts to accumulate photoelectrons responsive to an image impinging on the pixel. During the transport period, the voltages applied to three gate electrodes, for example 17,20,17', are, for example, switched from −3 Volts to 7 Volts, and the voltage applied to the remaining one gate electrode, for example 20', is switched from 0 Volts to 10 Volts. The electronic shutter/charge reset function is obtained by providing, e.g. −5 Volts, to all four gates 17,20,17',20' and by providing a pulse (Vnspulse) to the, in this case n-type, substrate 1. The voltage pulse is sufficiently high so that charges can pass the reduced barrier formed by the constrictions (in electrical properties) of the second layer.

The invention is not limited to the particular embodiments described above. Many variations are possible according to the teaching discussed above. By way of example, a description has been given of an n-type buried channel sensor with vertical anti-blooming. A p-type buried channel sensor is one variation that may be made and used according to the teaching above. The present invention can also advantageously be employed for the manufacture of other charge-coupled image sensors, such as an interline image sensor.

Another variation may be found in the way the constriction in the thickness of the e.g. p-well is formed. The constriction in the thickness of the well may be formed by locally forming n-type extensions of the underlying region, in this case an n-type region. Such an extension may be formed by a local implantation, and if desired, combined with a diffusion step. In such a case, the p-well may be formed over a larger area by a uniform/homogeneous process step. This still may be advantageously a local p-type implantation since other circuitry surrounding the sensor can still be made in n-type silicon. The p-well might also be formed by epitaxy that might be converted from a p-type epitaxy to an n-type channel by an n-type implantation around the sensor. The n-type extension can be formed before or after formation of the p-well. The n-type extensions are n-type regions that are connected to the third layer (e.g. the substrate) but that are positioned above the upper border of the third layer. They may be formed e.g. by locally implanting extra n-type impurities into the substrate that are out-diffused from the latter at the moment that the second layer (which is e.g. p-type) is present above the third layer. The out-diffused n-type impurities over compensate local parts of the second layer and convert these parts into n-type regions that thus form the n-type extensions of the n-type third layer/substrate.

With respect to the distribution and group structure of the higher doped regions in the channel of the device of the second embodiment described above, it is noted that such a distribution and structure implies the before mentioned advantages of a homogenous sensitivity in the center of the pixel, and thus, a better angular response. Homogeneous in this respect means that the sensitivity (i.e. the electrical response to an optical signal) does not vary much in the lateral directions, i.e. directions (say x and y) that are parallel to the surface of the semiconductor body/the device. The angular response relates to a radiation ray that strikes the device at an angle deviating from the normal direction (i.e. perpendicular to the surface of the device/semiconductor body). If the homogeneity of the sensitivity is not good around e.g. the center of the pixel, such a ray may face a different e.g. lower sensitivity. The advantages of homogeneous sensitivity are in and of themselves already very attractive. Such a distribution and structure thus can be already used with advantage also without the measure that is essential for the present invention, namely the rotation of the line-shaped constrictions over 90 degrees.

As a more specific example, a charge coupled device 100, of the buried channel type with a semiconductor body 30 includes a first layer 12 of a first conductivity type, a second layer 8 of a second conductivity type opposite to the first, and a third layer 1 of the first conductivity type. The first layer 12 adjoins a surface of the semiconductor body 30 and forms a buried channel for storage and transport of electric charge. The second layer 8 lies below and adjoins the first layer 12. The second layer 8 forms a burying layer of the channel, and the second layer 8 forms a barrier layer. The third layer 1 lies below and adjoins the second layer 8. The third layer 1 may be a semiconductor substrate or a semiconductor region deposited on such a substrate (e.g., in the form of an epitaxial layer or even on any other substrate). The third layer 1 is the layer through which excess charge can be drained from the first layer 12. The surface of the semiconductor body 30 is provided with a system of electrodes with a series of gate electrodes 17, 20 which are situated above the buried channel. The system of electrodes are connected to a voltage source for the at least temporary application of such a voltage to the gate electrodes 17, 20 that an inversion layer of the second conductivity type is formed adjoining the surface below the gate electrodes 17, 20. Means are present for obtaining a built-in potential difference in the channel whereby potential wells in which charge can be stored alternating with potential barriers are formed in the channel upon the application of equal voltages to the gate electrodes 17, 20. For example, potential profiles are obtained by dopant implants along the channel. The amount and type of dopant to be implanted depends on the voltages that are to be applied to the gate electrodes according to the specific design. Means are present for charge reset through the barrier layer. The means for charge reset include constrictions 8A in the thickness or the doping concentration of the second layer 8 below the channels that viewed in projection are line-shaped. The line-shaped constrictions 8A in the thickness or the doping concentration of the second layer 8 run perpendicular to the length direction L of the channel and parallel to the gate electrodes 17, 20. At least one line shaped constriction 8A is positioned below each series of gate electrodes 17, 20, 17', and 20'.

As another example, a method of manufacturing the charge coupled device 100 that has first, secondhand third layers, the first layer forming a buried channel, is characterized in that line-shaped constrictions 8A in the thickness or the doping concentration of the second layer are formed such that they run perpendicular to the length direction L of the channel and parallel to gate electrodes 17, 20 and in that at least one line shaped constriction 8A is positioned below each series of gate electrodes 17, 20. The charge coupled device 100 is of the buried channel type with a semiconductor body 30 in which are formed the first layer 12 of a first conductivity type, the second layer 8 of the second conductivity type opposite to the first, and the third layer 1 of the first conductivity type. The first layer adjoins a surface of the body 30 and forms a buried channel for storage and transport of electric charge. The second layer lies below and adjoins the first layer 12 and forms a barrier layer. The third layer lies below and adjoins the second layer 8 and is a layer through which excess charge can be drained from the first layer. The surface of the semiconductor body 30 is provided with a system of electrodes forming a series of gate electrodes 17, 20. The series of gate electrodes are situated above the buried channel and are connected to a voltage source for the at least temporary application of such a voltage to the gate electrodes 17, 20. The voltage applied to the gate electrodes is such that an inversion layer of the second conductivity type adjoining the surface may be formed below the gate electrodes 17,20. Means are provided for obtaining a built-in potential difference in the channel whereby potential wells in which charge can be stored alternating with potential barriers are formed in the channel upon the application of equal voltages to the gate electrodes 17, 20. Means are provided for charge reset, said means include constrictions in the thickness 8A or the doping concentration of the second layer 8 below the channels that viewed in projection are line-shaped.

Having described preferred embodiments of a novel pixel (which are intended to be illustrative and not limiting), it is noted that modifications and variations can be made by persons skilled in the art in light of the above teachings. It is therefore to be understood that changes may be made in the particular embodiments of the invention disclosed which are within the scope of the invention as defined by the appended claims.

Having thus described the invention with the details and particularity required by the patent laws, what is claimed and desired protected by Letters Patent is set forth in the appended claims.

What is claimed is:

1. A charge coupled device of the buried channel type with a semiconductor body comprising:
   a first layer of a first conductivity type which adjoins a surface of the semiconductor body and which forms a buried channel for storage and transport of electric charge;
   a second layer of a second conductivity type opposite to the first which lies below and adjoins the first layer; and
   a third layer of the first conductivity type which lies below and adjoins the second layer and through which excess charge can be drained from the first layer,
   wherein the surface is provided with a system of electrodes with a series of gate electrodes which are situated above the buried channel and which are connected to a voltage source for the at least temporary application of such a voltage to the gate electrodes that an inversion layer of the second conductivity type is formed adjoining the surface below the gate electrodes, while means are present for obtaining a built-in potential difference in the channel whereby potential wells in which charge can be stored alternating with potential barriers are formed in the channel upon the application of equal voltages to the gate electrodes, while means are present for charge reset through the second layer, said means comprising constrictions in the thickness or the doping concentration of the second layer below the channel that viewed in projection are line-shaped, wherein the line-shaped constrictions in the thickness or the doping concentration of the second layer run perpendicular to the length direction of the channel and parallel to the gate electrodes, and wherein at least one line shaped constriction is positioned below the series of gate electrodes.

2. A charge coupled device as claimed in claim 1, characterized in that the means for obtaining a built-in potential difference in the channel comprise a gradient in the doping concentration in the first layer in the length direction of the channel such that the doping concentration is higher in regions below a first group of electrodes and lower below a second group of electrodes, the gate electrodes associated with the first group of electrodes being interdigited with the gate electrodes associated with the second group of electrodes.

3. A charge coupled device as claimed in claim 1, characterized in that the means for obtaining a built-in potential difference in the channel comprises a gradient in the doping concentration in the first layer in the length direction of the channel such that the doping concentration is higher in regions below a first group of electrodes comprising sets of three neighboring gate electrodes and lower below a second group of electrodes comprising single gate electrodes that are interdigited with the sets of neighboring gate electrodes of the electrodes of the first group.

4. A charge coupled device as claimed in claim 2 or 3, characterized in that a lineshaped constrictions are centered with respect to the regions in which the doping concentration in the channel is higher.

5. A charge coupled device as claimed in claim 1, characterized in that the gate electrodes are alternatingly formed in two different interposed layers of poly silicon.

6. A charge coupled device as claimed in claim 1, characterized in that the gate electrodes are formed in three different interposed layers of poly silicon.

7. A charge coupled device as claimed in claim 6, characterized in that the gate electrodes are formed such as to form a three phase pixel.

8. A charge coupled image sensor comprising a charge coupled device as claimed in claim 1.

9. A method of manufacturing a charge coupled device of the buried channel type with a semiconductor body in which are formed a first layer of a first conductivity type which adjoins a surface of the body and which forms a buried channel for storage and transport of electric charge, a second layer of the second conductivity type opposite to the first which lies below and adjoins the first layer and forms a barrier layer, and a third layer of the first conductivity type which lies below and adjoins the second layer and through which excess charge can be drained from the first layer, the surface being provided with a system of electrodes with a series of gate electrodes which are situated above the buried channel and which are connected to a voltage source for the at least temporary application of such a voltage to the gate electrodes that an inversion layer of the second conductivity type adjoining the surface may be formed below the gate electrodes, while means are provided for obtaining a built-in potential difference in the channel whereby potential wells in which charge can be stored alternating with potential barriers are formed in the channel upon the application of equal voltages to the gate electrodes, and while means are provided for charge reset said means comprising constrictions in the thickness or the doping concentration of the second layer below the channel that viewed in projection are lineshaped, characterized in that the line-shaped constrictions in the thickness or the doping concentration of the second layer are formed such that they run perpendicular to the length direction of the channel and parallel to the gate electrodes and in that at least one line shaped constriction is positioned below the series of gate electrodes.

10. A method as claimed in claim 9, characterized in that for the means for obtaining a built-in potential difference in the channel a gradient in the doping concentration in the first layer in the length direction of the channel is chosen such that the doping concentration is higher in regions below a first group of electrodes and lower below a second group of electrodes, whereby the gate electrodes associated with the first group of electrodes are interdigited with the gate electrodes associated with the second group of electrodes.

11. A method as claimed in claim 10, characterized in that for the means for obtaining a built-in potential difference in the channel a gradient in the doping concentration in the length direction of the channel is chosen such that the doping concentration is higher in regions below a first group of electrodes comprising sets of three neighboring gate electrodes and lower below a second group of electrodes comprising single gate electrodes that are interdigited with the sets of neighboring gate electrodes of the electrodes of the first group.

12. A method as claimed in claim 10 or 11, characterized in that the line-shaped constrictions are centered with respect to the regions in which the doping concentration is higher in the channel.

13. A charge coupled device of the buried channel type with a semiconductor body comprising:

a first layer of a first conductivity type which adjoins a surface of the semiconductor body and which forms a buried channel for storage and transport of electric charge;

a second layer of a second conductivity type opposite to the first which lies below and adjoins the first layer, which form the buried layer of the channel and which forms a barrier layer; and a third layer of the first conductivity type which lies below and adjoins the second layer and through which excess charge can be drained from the first layer, wherein the surface is provided with a system of electrodes with a series of gate electrodes which are situated above the buried channel and which are connected to a voltage source for the at least temporary application of such a voltage to the gate electrodes that an inversion layer of the second conductivity type is formed adjoining the surface below the gate electrodes, while means are present for obtaining a built-in potential difference in the channel whereby potential wells in which charge can be stored alternating with potential barriers are formed in the channel upon the application of equal voltages to the gate electrodes, while means are present for charge reset through the barrier layer said means comprising regions of the second layer below the channel in which the thickness or the doping concentration of the second layer is smaller than outside said regions, said regions being further called constrictions, which constrictions viewed in projection are line-shaped, having a length larger than a width, wherein the line-shaped constrictions in the thickness or the doping concentration of the second layer run with their length perpendicular to the length direction of the channel and parallel to the gate electrodes, and wherein at least one line shaped constriction is positioned below the series of gate electrodes.

* * * * *